US010962827B2

(12) United States Patent
Chang

(10) Patent No.: US 10,962,827 B2
(45) Date of Patent: Mar. 30, 2021

(54) BACK-LIGHT MODULE

(71) Applicant: Au Optronics Corporation, Hsinchu (TW)

(72) Inventor: Yi-Wen Chang, Hsinchu (TW)

(73) Assignee: Au Optronics Corporation, Hsinchu (TW)

(*) Notice: Subject to any disclaimer, the term of this patent is extended or adjusted under 35 U.S.C. 154(b) by 0 days.

(21) Appl. No.: 16/548,814

(22) Filed: Aug. 22, 2019

(65) Prior Publication Data

US 2020/0174317 A1 Jun. 4, 2020

(30) Foreign Application Priority Data

Nov. 29, 2018 (TW) ................................ 10714273.4

(51) Int. Cl.

| | |
|---|---|
| ***G02F 1/13357*** | (2006.01) |
| ***G02F 1/1335*** | (2006.01) |
| ***F21V 5/00*** | (2018.01) |

(52) U.S. Cl.

CPC .. *G02F 1/133603* (2013.01); *G02F 1/133606* (2013.01); *F21V 5/005* (2013.01); *G02F 1/133607* (2021.01); *G02F 1/133609* (2013.01); *G02F 1/133611* (2013.01)

(58) Field of Classification Search

CPC ......... G02F 1/133603; G02F 1/133606; G02F 2001/133607; G02F 1/133607; G02F 1/133609; G02F 1/133611; F21V 5/005

See application file for complete search history.

(56) References Cited

U.S. PATENT DOCUMENTS

| | | | |
|---|---|---|---|
| 7,320,538 B2 | 1/2008 | Ko et al. | |
| 2006/0146566 A1 | 7/2006 | Ko et al. | |
| 2007/0024994 A1 | 2/2007 | Whitney et al. | |
| 2007/0091616 A1* | 4/2007 | Cassarly | G02B 5/021 362/341 |
| 2008/0303977 A1* | 12/2008 | Sekiguchi | G02F 1/133606 349/64 |
| 2009/0015142 A1 | 1/2009 | Potts et al. | |
| 2009/0040425 A1* | 2/2009 | Chang | G02F 1/133606 349/64 |
| 2009/0168401 A1* | 7/2009 | Kwon | G02F 1/133611 362/97.1 |

(Continued)

FOREIGN PATENT DOCUMENTS

| | | |
|---|---|---|
| CN | 200827043 | 10/2018 |
| JP | 2010003598 | 1/2010 |

(Continued)

*Primary Examiner* — Alexander K Garlen
*Assistant Examiner* — Colin J Cattanach
(74) *Attorney, Agent, or Firm* — JCIPRNET

(57) ABSTRACT

A back-light module includes a substrate, a plurality of light-emitting devices, and an optical film. The light-emitting devices are disposed on the substrate and are arranged in a rectangular array along an X direction and a Y direction. The optical film is disposed on the light-emitting devices and includes a plurality of pyramid structures arranged in arrays. Each pyramid structure includes four bottom edges. An angle between a bottom edge and the X direction and an angle between another bottom edge and the Y direction are greater than 0 degree and less than 45 degrees.

10 Claims, 10 Drawing Sheets

(56) References Cited

U.S. PATENT DOCUMENTS

2009/0262428 A1* 10/2009 Kurokawa ............. G02B 5/045 359/599
2010/0027242 A1* 2/2010 Kishine .................. G02B 5/045 362/97.1
2010/0033957 A1* 2/2010 Lin ...................... G02B 5/0278 362/97.2
2013/0107574 A1* 5/2013 Baek ................. G02F 1/133603 362/612
2017/0030549 A1* 2/2017 Kamada ............ G02F 1/133603
2017/0090241 A1* 3/2017 Eo ........................ G02B 6/0053
2018/0088266 A1* 3/2018 Kim .................. G02F 1/133617
2019/0285950 A1* 9/2019 Liu ...................... H05K 1/0204
2019/0391450 A1* 12/2019 Mukumoto ....... G02F 1/133611

FOREIGN PATENT DOCUMENTS

JP 2012114003 6/2012
TW 200641478 12/2006
TW 200712567 4/2007
TW 200827780 7/2008
TW I477186 3/2015
TW I481909 4/2015

* cited by examiner

BACK-LIGHT MODULE

CROSS-REFERENCE TO RELATED APPLICATION

This application claims the priority benefit of Taiwan application serial no. 107142734, filed on Nov. 29, 2018. The entirety of the above-mentioned patent application is hereby incorporated by reference herein and made a part of this specification.

BACKGROUND OF THE INVENTION

Technical Field

The disclosure relates to a back-light module and, more particularly, to a back-light module having pyramid structures.

Description of Related Art

The existing liquid crystal display device uses a back-light module as a light source, and whether light can leave the liquid crystal display device depends on liquid crystal. In general, a back-light module includes a plurality of light emitting devices. In order for the light emitted by the light-emitting devices to spread more evenly, a diffuser plate is usually provided on the light-emitting devices. The diffuser plate changes the path of the light emitted by the light-emitting devices through physical phenomena such as refraction, reflection, scattering, etc. The light leaving the diffuser plate often includes exit light exiting at large angles. In other words, the diffuser plate performs the function of magnifying the exit angle of the exit light. However, due to the poor efficiency of using the exit light exiting at large exit angle, it is easy to make the brightness of a screen on the display device insufficient.

SUMMARY OF THE INVENTION

The disclosure provides a back-light module capable of addressing the problem with a light-emitting device emitting light that spreads unevenly while maintaining the efficiency of using light.

An embodiment of the disclosure provides a back-light module including a substrate, a plurality of light emitting devices, and an optical film. The plurality of light emitting devices are located on the substrate and are arranged in a rectangular array along an X direction and a Y direction. The optical film is located on the light emitting devices and includes a plurality of pyramid structures arranged in arrays. Each pyramid structure includes four bottom edges. An angle between a bottom edge and the X direction and an angle between another bottom edge and the Y direction are greater than 0 degree and less than 45 degrees.

In view of the above, the pyramid structures in the optical film can change a transmission path of the light emitted by the light-emitting devices to allow the light-back module to emit light that spreads evenly.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
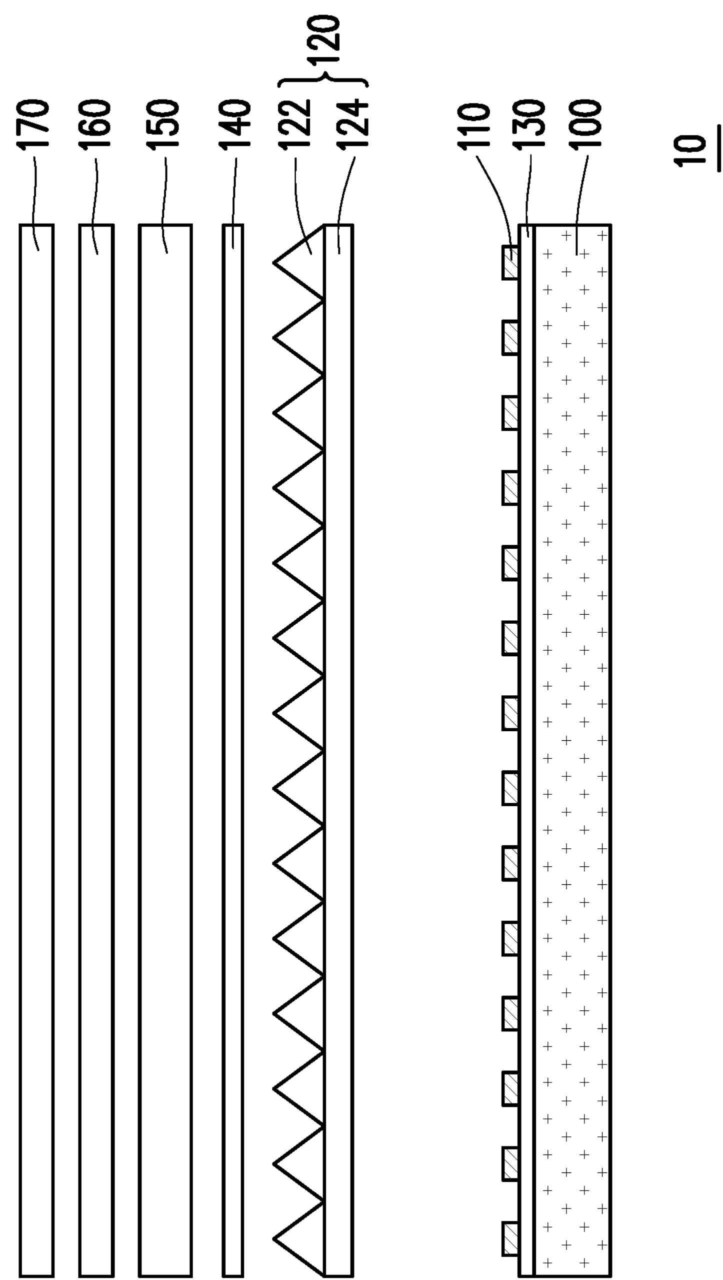
FIG. 1A is a cross-sectional view of a back-light module according to an embodiment of the disclosure.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
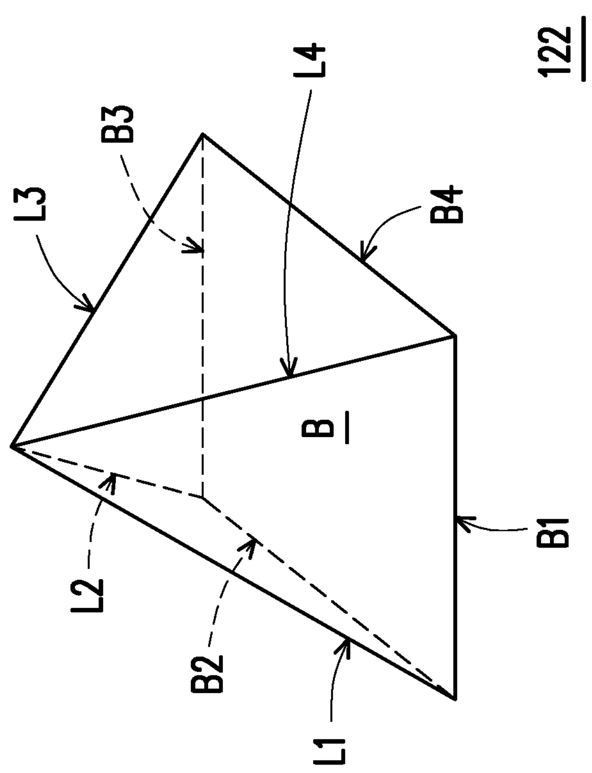
FIG. 1B is a perspective view of a pyramid structure according to an embodiment of the disclosure.

FIG. 1A is a cross-sectional view of a back-light module according to an embodiment of the disclosure. FIG. 1B is a perspective view of a pyramid structure according to an embodiment of the disclosure.

Referring to FIG. 1A, a back-light module 10 includes a substrate 100, a plurality of light-emitting devices 110, and an optical film 120. In the embodiment, the back-light module 10 further includes a reflective layer 130, a beam splitter film 140, a color conversion layer 150, a first prism sheet 160, and a second prism sheet 170.

The plurality of light-emitting devices 110 are located on the substrate 100. The light-emitting devices 110 are, for example, mini light emitting diodes (mini LEDs) or other light sources. The light emitting devices 110 are, for example, blue light-emitting devices or white light-emitting devices. In the embodiment, the light-emitting devices 110 are, for example, blue light-emitting devices.

In the embodiment, the reflective layer 130 is further disposed between the light emitting devices 110 and the substrate 100, but the disclosure is not limited thereto. In other embodiments, the substrate 100 itself performs the function of reflecting light, so the reflective layer 130 is needless.

Referring to FIGS. 1A and 1B, the optical film 120 is located on the light-emitting devices 110. The optical film 120 includes a plurality of pyramid structures 122 arranged in arrays and a carrier board 124. Each pyramid structure 122 includes a rectangular bottom surface B and four edges L1 to L4 connected to the rectangular bottom surface B. The rectangular bottom surface B includes four bottom edges B1 to B4. In the embodiment, the rectangular bottom surface B of the pyramid structure 122 is a square, but the disclosure is not limited thereto. In the embodiment, the pyramid structures 122 are formed on the carrier board 124 and may be integrated with the carrier board 124, but the disclosure is not limited thereto. Materials of the pyramid structures 122 and the carrier board 124 include a resin, polycarbonate (PC), polymethyl methacrylate (PMMA), or other suitable materials.

Figure 2:
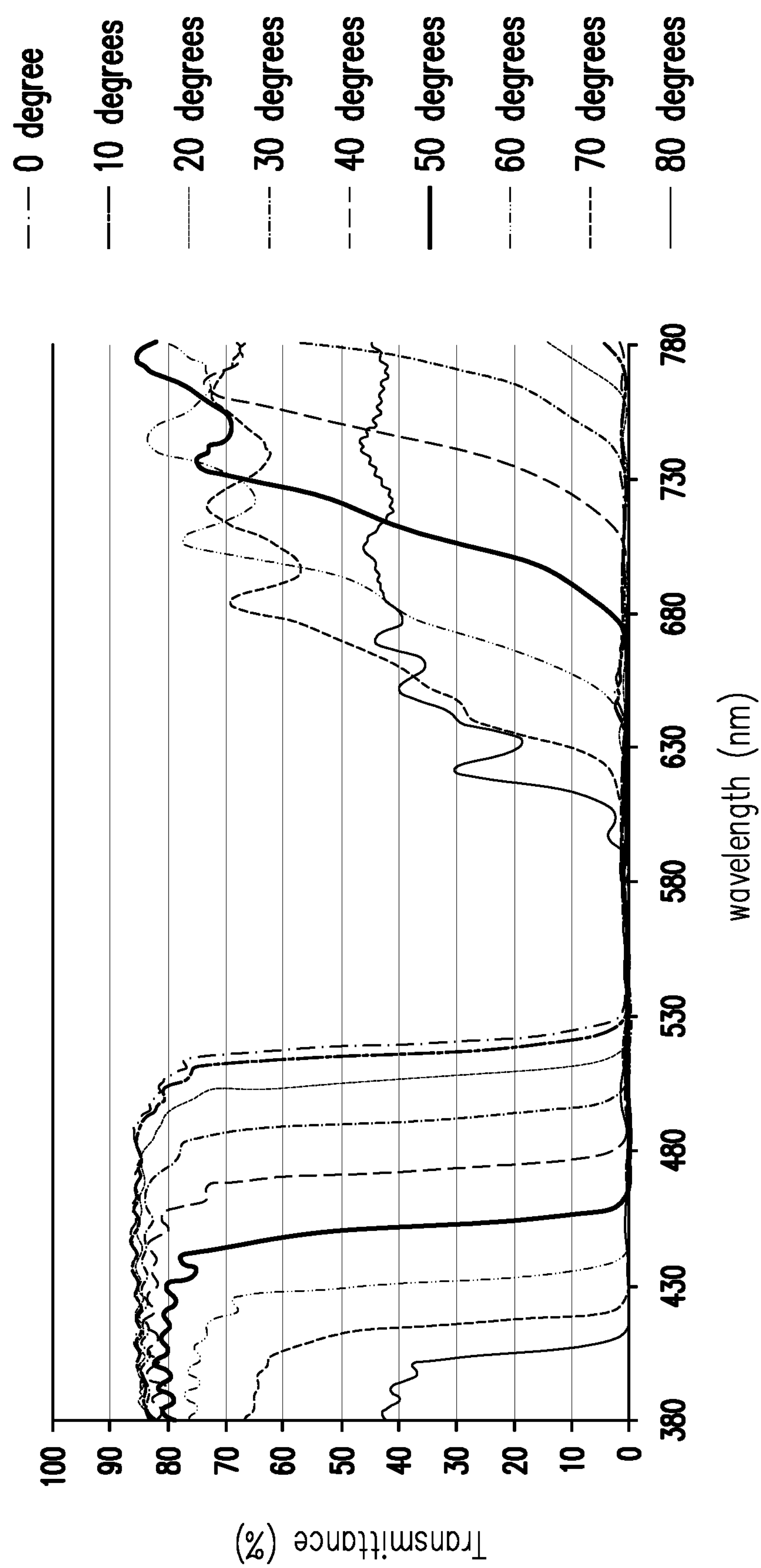
FIG. 2 is a schematic diagram showing the transmittance of a beam splitter film at different wavelengths according to an embodiment of the disclosure.

The beam splitter film 140 is located on the optical film 120. FIG. 2 is a schematic view showing the transmittance of a beam splitter film (e.g., the beam splitter film 140 of FIG. 1A) at different wavelengths according to an embodiment of the disclosure. The vertical axis in FIG. 2 indicates transmittance, while the horizontal axis indicates a wavelength of light. Different lines in FIG. 2 indicate light having different incident angles.

Referring to FIG. 2, the transmittance of the beam splitter film 140 varies with the incident angle and wavelength of light. In the embodiment, the light splitter film 140 has higher transmittance for blue light (which has a wavelength of about 450 nm) having a smaller incident angle (e.g., less than 50 degrees) and has relatively high reflectance for blue light, green light (which has a wavelength of about 540 nm), and red light (which has a wavelength of about 630 nm) having a large incident angle.

Referring to FIG. 1A, the pyramid structures 122 of the optical film 120 allows the light to have a suitable light exit angle. Therefore, compared with the traditional diffuser plate that obviously increases the light exit angle, the optical film 120 according to the embodiment can increase the efficiency of the forward light of the beam splitter film 140.

The color conversion layer 150 is located on the beam splitter film 140 and includes, for example, a quantum dot material or a fluorescent material. The color conversion layer 150 can convert the color of light. For example, after passing through the optical film 120 and the beam splitter film 140, some light is converted by the color conversion layer 150 into red light and/or green light or light having a wavelength greater than 500 nm. In the embodiment, the beam splitter film 140 has high reflectance for red light and green light. Therefore, the red light and/or green light emitted by the color conversion layer 150 can be reflected by the beam splitter film 140, thereby increasing the efficiency of using light.

The first prism sheet 160 is located on the color conversion layer 150. The second prism sheet 170 is located on the first prism sheet 160. In some embodiments, an extending direction of a prism structure on the first prism sheet 160 is orthogonal to an extending direction of a prism structure on the second prism sheet 170.

Figure 3:
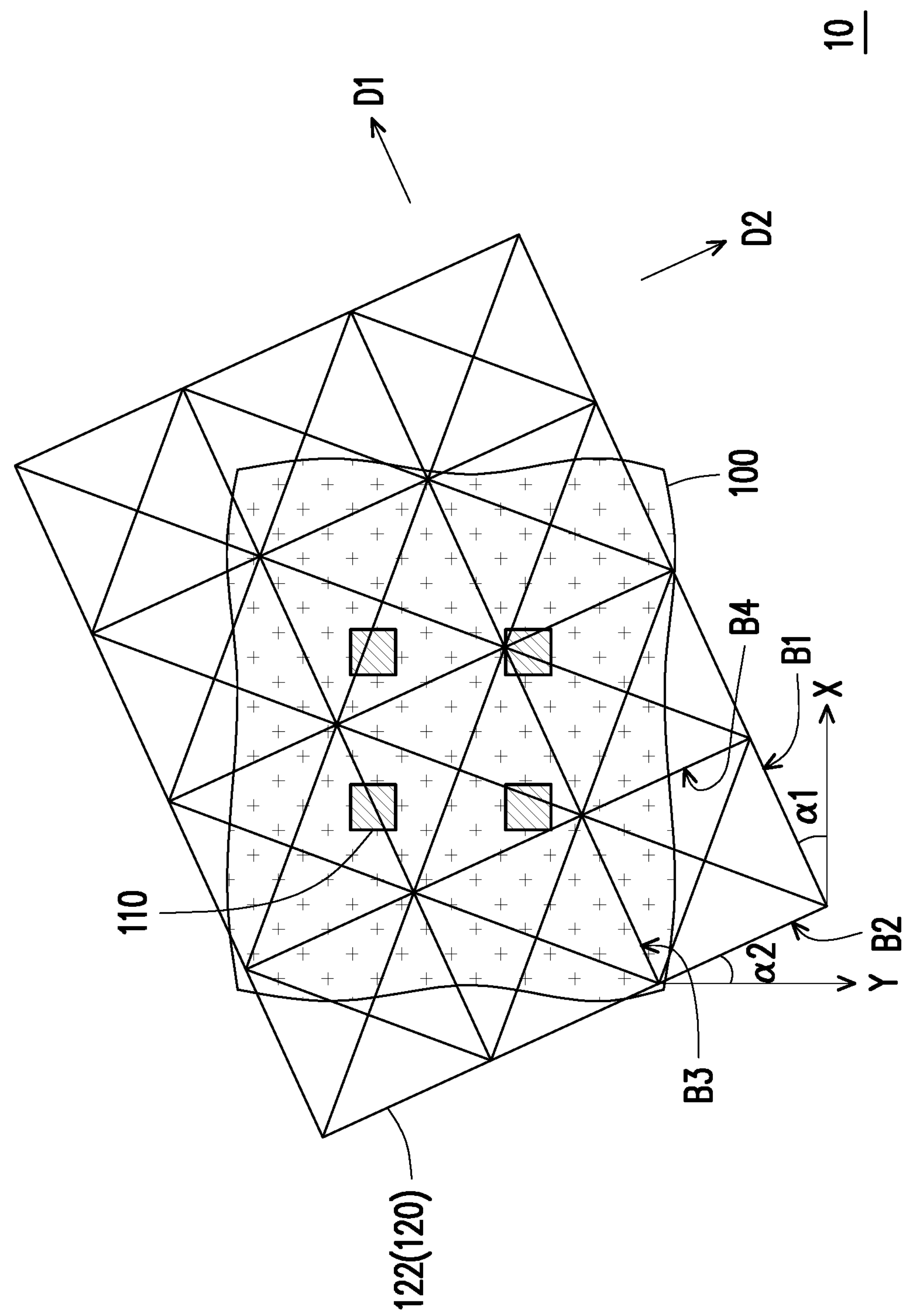
FIG. 3 is a top view of a back-light module according to an embodiment of the disclosure.

FIG. 3 is a top view of a back-light module according to an embodiment of the disclosure. For ease of explanations, FIG. 3 illustrates the substrate 100, the light-emitting device 110, and the optical film 120 with other components omitted. For the omitted components, reference may be made to descriptions about an embodiment of FIG. 1A, and therefore details are not described herein again.

Referring to FIGS. 1B and 3, the light-emitting devices 110 of the back-light module 10 are arranged in a rectangular array along the X direction and the Y direction. The X direction is orthogonal to the Y direction. An angle $\alpha 1$ between a bottom edge B1 of the pyramid structure 122 and the X direction and an angle $\alpha 2$ between another bottom edge B2 and the Y direction are greater than 0 degree and less than 45 degrees. In the embodiment, the bottom edge B1 is parallel to a bottom edge B3, and the bottom edge B2 is parallel to a bottom edge B4. In other words, the same angle $\alpha 1$ is between the bottom edge B1 and the X direction as between the bottom edge B3 and the X direction, and the same angle $\alpha 2$ is between the bottom edge B2 and the Y direction as between the bottom edge B4 and the Y direction.

In the embodiment, the pyramid structures 122 are arranged in a rectangular array along a direction D1 and a direction D2. The direction D1 is orthogonal to the direction D2 and is parallel to the bottom edges B1 and B3. The direction D2 is parallel to the bottom edges B2 and B4.

Although adjacent pyramid structures 122 are in contact with each other in the embodiment, the disclosure is not limited thereto. In other embodiments, there are gaps between the adjacent pyramid structures 122.

In view of the above, the pyramid structure 122 can change a transmission path of light emitted by the light-emitting device 110, thereby allowing the back-light module to emit light that spreads evenly.

Figure 4:
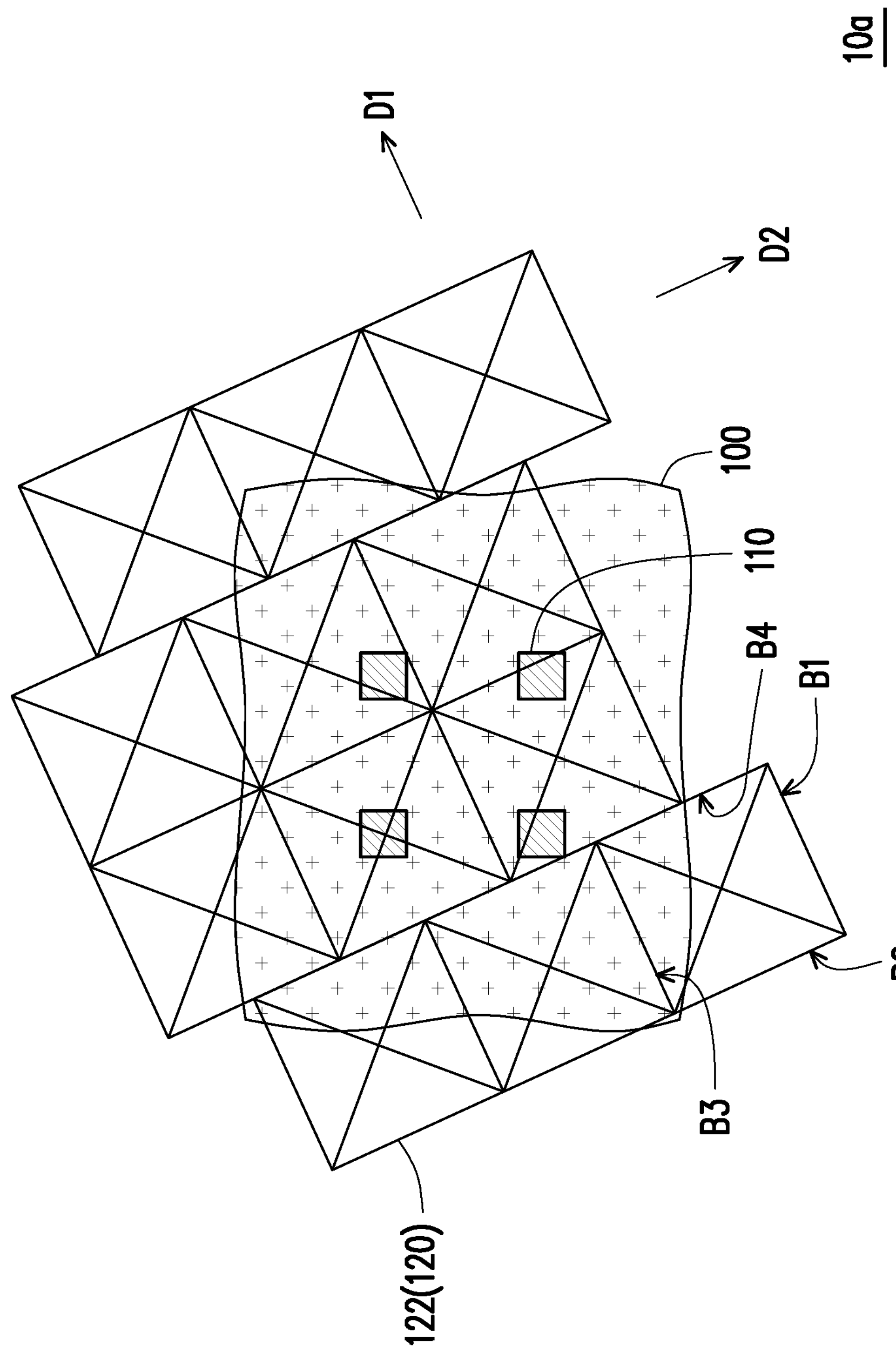
FIG. 4 is a top view of a back-light module according to an embodiment of the disclosure.

FIG. 4 is a top view of a back-light module according to an embodiment of the disclosure. It should be noted that the embodiment of FIG. 4 follows the same reference numerals and some content of the embodiment of FIG. 3. The same or similar reference numeral denotes the same or similar element with descriptions about the same technique omitted. For the omitted descriptions, reference may be made to the above embodiment, and details are not described herein again.

The main difference between a back-light module 10*a* of FIG. 4 and the backlight module 10 of FIG. 2 is that the pyramid structures 122 of the back-light module 10*a* are arranged in a misaligned arrangement.

Referring to FIG. 4, some pyramid structures 122 are misaligned. For example, the bottom edges B1 and B3 of the misaligned pyramid structures 122 are not aligned with the bottom edges B1 and B3 of the pyramid structures 122 in adjacent rows.

In view of the above, the pyramid structure 122 can change the transmission path of light emitted by the light-emitting device 110, thereby allowing the back-light module to emit light that spreads evenly.

Figure 5:
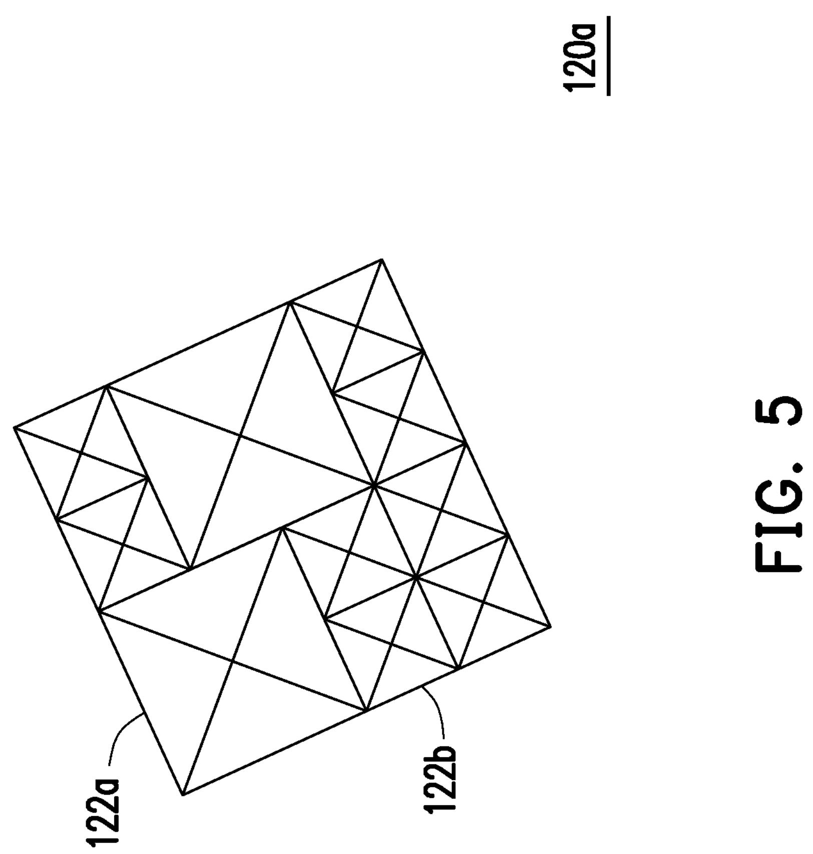
FIG. 5 is a top view of an optical film according to an embodiment of the disclosure.

FIG. 5 is a top view of an optical film according to an embodiment of the disclosure. It should be noted that the embodiment of FIG. 5 follows the same reference numerals and some content of the embodiment of FIG. 4. The same or similar reference numeral denotes the same or similar element with descriptions about the same technique omitted. For the omitted descriptions, reference may be made to the above embodiment, and details are not described herein again.

Referring to FIG. 5, the pyramid structures of an optical film 120*a* comes in one or more sizes. For example, the optical film 120*a* includes pyramid structures 122*a* and pyramid structures 122*b* of different sizes. A bottom edge of the pyramid structures 122*a* is greater than a bottom edge of the pyramid structures 122*b*, but the height of the pyramid structures 122*a* is not limited to be greater than the height of the pyramid structures 122*b*.

Although the optical film 120*a* includes pyramid structures of two sizes as an example in the embodiment, the disclosure is not limited thereto. In other embodiments, the optical film 120*a* includes pyramid structures of three or more sizes.

Figure 6:
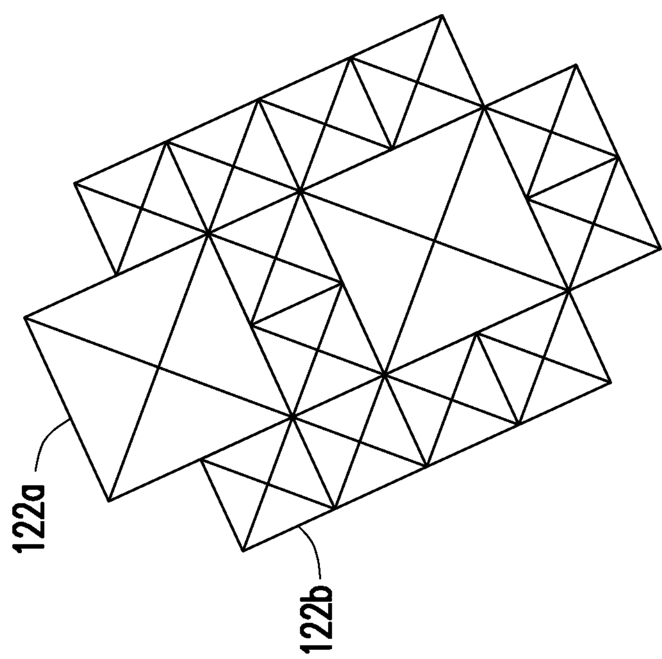
FIG. 6 is a top view of an optical film according to an embodiment of the disclosure.

FIG. 6 is a top view of an optical film according to an embodiment of the disclosure. It should be noted that the embodiment of FIG. 6 follows the same reference numerals and some content of the embodiment of FIG. 5. The same or similar reference numeral denotes the same or similar element with descriptions about the same technique omitted.

For the omitted descriptions, reference may be made to the above embodiment, and details are not described herein again.

The main difference between an optical film 120*b* of FIG. 6 and the optical film 120*a* of FIG. 5 is that pyramid structures in the optical film 120*b* are arranged differently from pyramid structures in the optical film 120*a*.

In the optical film 120*a* of FIG. 5, two pyramid structures 122*a* of a larger size are adjacent to each other. In the optical film 120*b* of FIG. 6, two pyramid structures 122*a* of a larger size are separated by the pyramid structure 122*b* of a smaller size.

Although FIGS. 5 and 6 show two kinds of the arrangement of pyramid structures, the disclosure is not limited thereto. The arrangement of pyramid structures can hinge on actual needs. In addition, the number of pyramid structures in an optical film can also hinge on actual needs.

Figure 7:
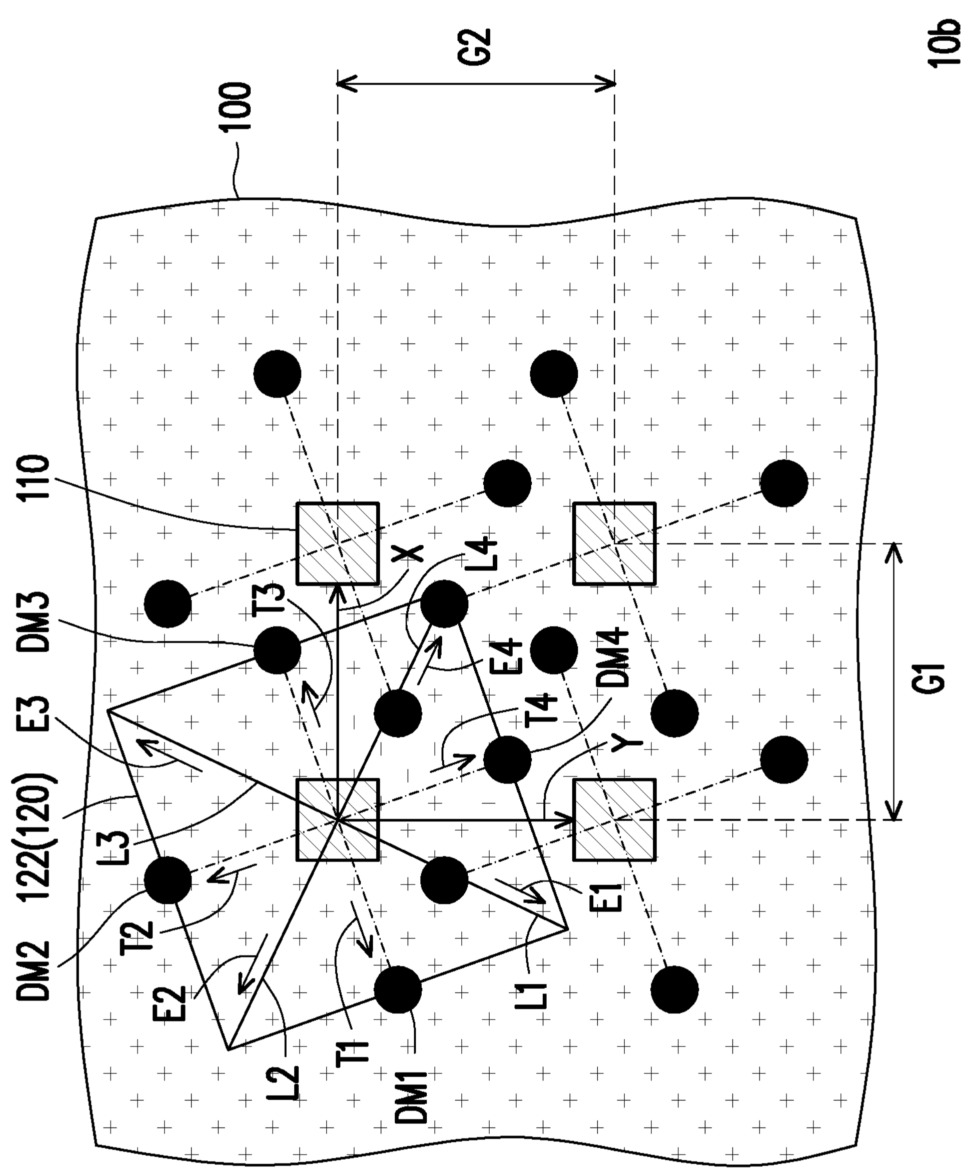
FIG. 7 is a top view of a back-light module according to an embodiment of the disclosure.

FIG. 7 is a top view of a back-light module according to an embodiment of the disclosure. It should be noted that the embodiment of FIG. 7 follows the same reference numerals and some content of the embodiment of FIG. 3. The same or similar reference numeral denotes the same or similar element with descriptions about the same technique omitted. For the omitted descriptions, reference may be made to the above embodiment, and details are not described herein again. For ease of explanations, FIG. 7 illustrates the substrate 100, the light-emitting devices 110, and one of the pyramid structures 122 in the optical film 120 with other components omitted. For the omitted components, reference may be made to descriptions about the embodiment of FIG. 1A, and therefore details are not described herein again.

Referring to FIGS. 1B and 7, in a back-light module 10*b*, a ratio of a pitch G1 of the light-emitting device 110 in the X direction to a pitch G2 of the light-emitting device in the Y direction is 1:1.

The pyramid structure 122 includes a rectangular bottom B and four edges L1 to L4 connected to the rectangular bottom B. Vertical projections of the edges L1 to L4 onto the substrate 100 extend along a first direction E1 to a fourth direction E4, respectively. The vertical projection of the edge L1 onto the substrate 100 extends along the first direction E1, and an angle β1 between the first direction E1 and the Y direction is 11 to 31 degrees. In the embodiment, an angle β1 of 21 degrees is preferable.

In the embodiment, the optical film 120 refracts and reflects light emitted by the light-emitting device 110, and forms a plurality of virtual light sources DM1 to DM4. Every four virtual light sources DM1 to DM4 correspond to one light emitting device 110. Viewed in the direction perpendicular to the substrate 100, the line connecting the virtual light source DM1 to the light-emitting device 110 extends along a direction T1 that is between the first direction E1 and the second direction E2. For example, an angle between the direction T1 and the first direction E1 is equal to an angle between the direction T1 and the second direction E2, but the disclosure is not limited thereto. Viewed in the direction perpendicular to the substrate 100, the line connecting the virtual light source DM2 to the light-emitting device 110 extends along a direction T2 that is between the second direction E2 and a third direction E3. For example, an angle between the direction T2 and the second direction E2 is equal to an angle between the direction T2 and the third direction E3, but the disclosure is not limited thereto. Viewed in the direction perpendicular of the substrate 100, the line connecting the virtual light source DM3 to the light-emitting device 110 extends in a direction T3 that is between the third direction E3 and a fourth direction E4. For example, an angle between the direction T3 and the third direction E3 is equal to an angle between the direction T3 and the fourth direction E4, but the disclosure is not limited thereto. Viewed in the direction perpendicular to the substrate 100, the line connecting the virtual light source DM4 to the light-emitting device 110 extends along a direction T4 that is between the fourth direction E4 and the first direction E1. For example, an angle between the direction T4 and the fourth direction E4 is equal to an angle between the direction T4 and the first direction E1, but the disclosure is not limited thereto.

In view of the above, the optical film 120 refracts light emitted by the light-emitting device 110 and forms the plurality of virtual light sources DM1 to DM4, so the back-light module 10*b* can emit light that spreads evenly.

Figure 8:
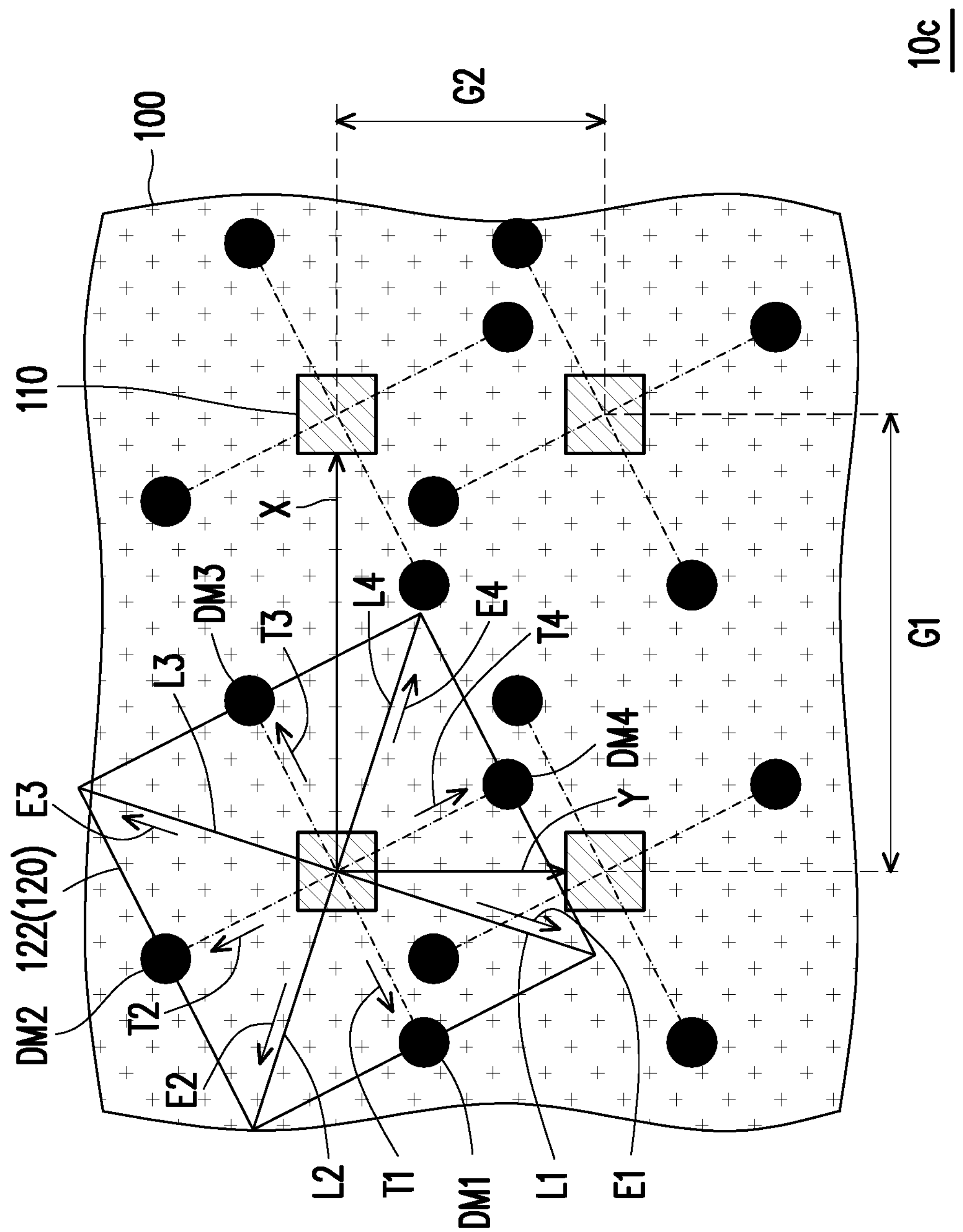
FIG. 8 is a top view of a back-light module according to an embodiment of the disclosure.

FIG. 8 is a top view of a back-light module according to an embodiment of the disclosure. It should be noted that the embodiment of FIG. 8 follows the same reference numerals and some content of the embodiment of FIG. 7. The same or similar reference numeral denotes the same or similar element with descriptions about the same technique omitted. For the omitted descriptions, reference may be made to the above embodiment, and details are not described herein again. For ease of explanations, FIG. 8 illustrates the substrate 100, the light-emitting devices 110, and one of the pyramid structures 122 in the optical film 120 with other components omitted. For the omitted components, reference may be made to descriptions about the embodiment of FIG. 1A, and therefore details are not described herein again.

The main difference between a back-light module 10*c* of FIG. 8 and the back-light module 10*b* of FIG. 7 is that in the back-light module 10*c*, the pitch G1 of the light-emitting device 110 in the X direction is greater than the pitch G2 of the light-emitting device 110 in the Y direction.

Referring to FIG. 8, a ratio of the pitch G1 of the light-emitting device 110 in the X direction to the pitch G2 of the light-emitting device 110 in the Y direction is 2:1.

The angle β1 between the first direction E1 and the Y direction is 11 to 31 degrees. In the embodiment, the angle β1 of 16 degrees is preferable.

In view of the above, the optical film 120 refracts light emitted by the light-emitting devices 110 and forms the plurality of virtual light sources DM1 to DM4, so the back-light module 10*c* can emit light that spreads evenly.

Figure 9:
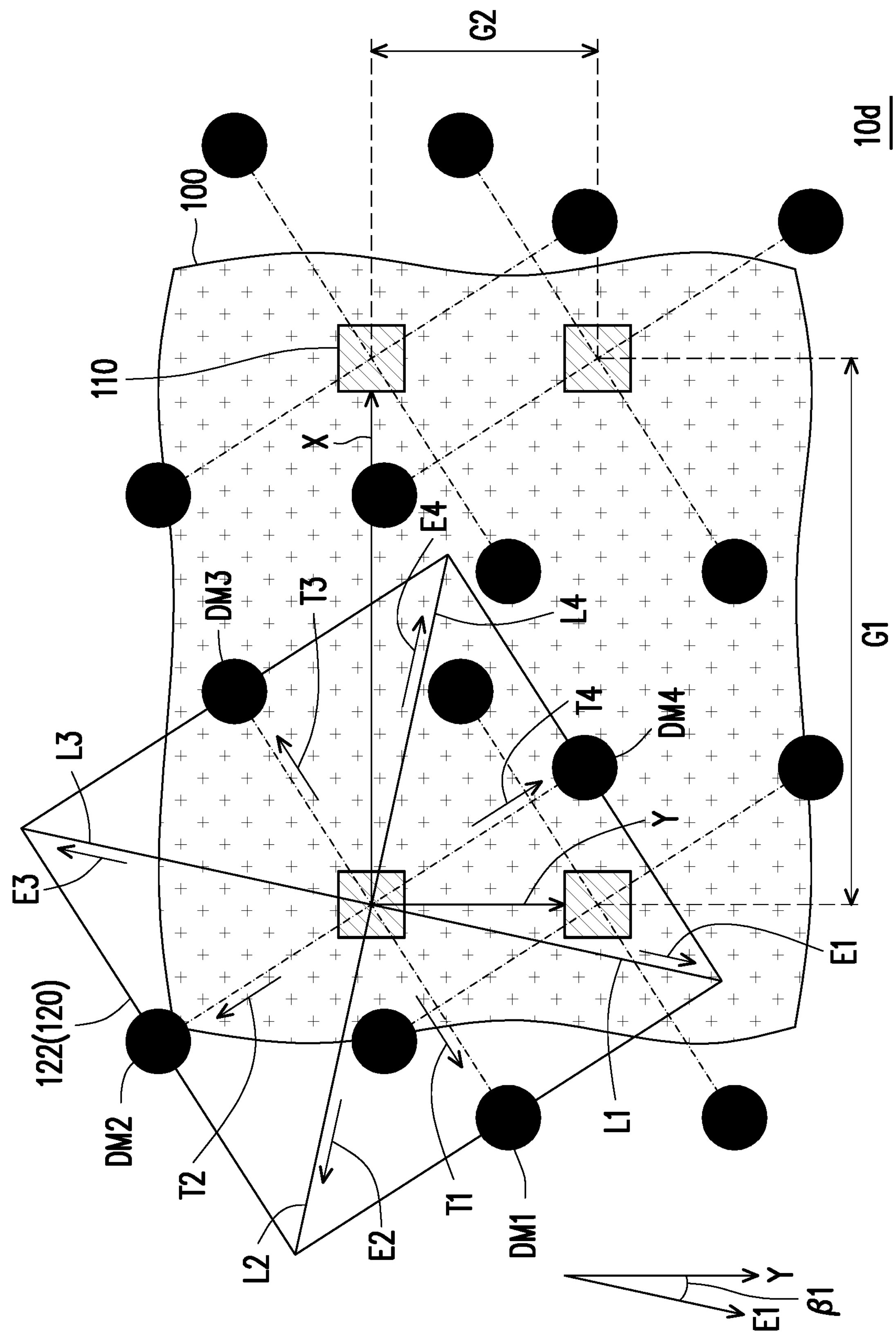
FIG. 9 is a top view of a back-light module according to an embodiment of the disclosure.

FIG. 9 is a top view of a back-light module according to an embodiment of the disclosure. It should be noted that the embodiment of FIG. 9 follows the same reference numerals and some content of the embodiment of FIG. 7. The same or similar reference numeral denotes the same or similar element with descriptions about the same technique omitted. For the omitted descriptions, reference may be made to the above embodiment, and details are not described herein again. For ease of explanations, FIG. 9 illustrates the substrate 100, the light-emitting devices 110, and one of the pyramid structures 122 in the optical film 120 with other components omitted. For the omitted components, reference may be made to descriptions about the embodiment of FIG. 1A, and therefore details are not described herein again.

The main difference between a back-light module 10*d* of FIG. 9 and the back-light module 10*b* of FIG. 7 is that in the back-light module 10*d*, the pitch G1 of the light-emitting device 110 in the X direction is greater than the pitch G2 of the light-emitting device 110 in the Y direction.

Referring to FIG. 9, a ratio of the pitch G1 of the light-emitting device 110 in the X direction to the pitch G2 of the light-emitting device 110 in the Y direction is 3:1.

The angle β1 between the first direction E1 and the Y direction is 11 to 31 degrees. In the embodiment, the angle β1 of 11 degrees is preferable.

In view of the above, the optical film 120 refracts light emitted by the light-emitting device 110 and forms the plurality of virtual light sources DM1 to DM4, so the back-light module 10*d* can emit light that spreads evenly.

In summary, the optical film refracts light emitted by the light-emitting device and forms the plurality of virtual light sources, so the back-light module can emit light that spreads evenly. In addition, compared with a traditional diffuser plate that obviously increases a light exit angle of light, the beam splitter film allows light passing through the optical film to penetrate more easily, thereby increasing the efficiency of using light.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A back-light module, comprising:

a substrate;

a plurality of light emitting devices, located on the substrate and arranged in a rectangular array along an X direction and a Y direction; and an optical film, located on the light emitting devices, wherein the optical film includes a plurality of pyramid structures arranged in arrays, and each pyramid structure includes four bottom edges, wherein an angle between a bottom edge and the X direction and an angle between another bottom edge and the Y direction is greater than 0 degree and less than 45 degrees, wherein each pyramid structure comprises a rectangular bottom, a top end above the rectangular bottom, and four side edges connected between the top end and the rectangular bottom, wherein a perpendicular projection of one of the side edges onto the substrate extends along a first direction, and an angle between the first direction and the Y direction is 11 to 21 degrees, wherein:

the plurality of light emitting devices includes a first light emitting device, a second light emitting device, a third light emitting device, and a fourth light emitting device; and a first connection line connecting the first light emitting device and the second light emitting device, a second connection line connecting the second light emitting device and the third light emitting device, a third connection line connecting the third light emitting device and the fourth light emitting device and a fourth connection line connecting the fourth light emitting device and the first light emitting device are constituted a rectangle shape; and the four immediate adjacent ones of the plurality of light emitting devices are arranged in a rectangular array and the pyramid structures are arranged in a misaligned arrangement such that the bottom edges of each of the pyramid structures are misaligned with the bottom edges of an adjacent one of the pyramid structures in the same direction.

2. The back-light module of claim 1, wherein a ratio of a pitch of the light emitting devices in the X direction to a pitch of the light emitting devices in the Y direction is 1:1.

3. The back-light module of claim 1, wherein a pitch of the light emitting devices in the X direction is greater than a pitch of the light emitting devices in the Y direction.

4. The back-light module of claim 3, wherein a ratio of the pitch of the light emitting devices in the X direction to the pitch of the light emitting devices in the Y direction is 2:1.

5. The back-light module of claim 3, wherein a ratio of the pitch of the light emitting devices in the X direction to the pitch of the light emitting devices in the Y direction is 3:1.

6. The back-light module of claim 1, wherein the pyramid structures come in one or more sizes.

7. The A back-light module, comprising:

a substrate;

a plurality of light emitting devices, located on the substrate and arranged in a rectangular array along an X direction and a Y direction; and an optical film, located on the light emitting devices, wherein the optical film includes a plurality of pyramid structures arranged in arrays, and each pyramid structure includes four bottom edges, wherein an angle between a bottom edge and the X direction and an angle between another bottom edge and the Y direction is greater than 0 degree and less than 45 degrees, wherein each pyramid structure comprises a rectangular bottom, a top end above the rectangular bottom, and four side edges connected between the top end and the rectangular bottom, wherein a perpendicular projection of one of the side edges onto the substrate extends along a first direction, and an angle between the first direction and the Y direction is 11 to 31 degrees, wherein:

the plurality of light emitting devices includes a first light emitting device, a second light emitting device, a third light emitting device, and a fourth light emitting device;

a first connection line connecting the first light emitting device and the second light emitting device, a second connection line connecting the second light emitting device and the third light emitting device, a third connection line connecting the third light emitting device and the fourth light emitting device and a fourth connection line connecting the fourth light emitting device and the first light emitting device are constituted a rectangle shape;

the four immediate adjacent ones of the plurality of light emitting devices are arranged in a rectangular array, and the pyramid structures are arranged in a misaligned arrangement such that the bottom edges of each of the pyramid structures are misaligned with the bottom edges of an adjacent one of the pyramid structures in the same direction.

8. The back-light module of claim 1, wherein materials of the pyramid structures comprise a resin, polycarbonate or polymethyl methacrylate.

9. The back-light module of claim 1, further comprising:

a beam splitter film, located on the optical film; and a color conversion layer, located on the beam splitter film.

10. The back-light module of claim 1, wherein the angle between the first direction and the Y direction is 21 degrees.

* * * * *